(12) United States Patent
Fujii et al.

(10) Patent No.: US 7,353,979 B2
(45) Date of Patent: Apr. 8, 2008

(54) METHOD OF FABRICATING SUBSTRATE PLACING STAGE

(75) Inventors: Tomoyuki Fujii, Nagoya (JP); Yasuyoshi Imai, Nagoya (JP); Tetsuya Kawajiri, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 229 days.

(21) Appl. No.: 10/945,566

(22) Filed: Sep. 20, 2004

(65) Prior Publication Data

US 2005/0118450 A1    Jun. 2, 2005

(30) Foreign Application Priority Data

Sep. 22, 2003   (JP) .............................. 2003-330493

(51) Int. Cl.
B23K 31/02 (2006.01)

(52) U.S. Cl. .................... 228/121; 228/234.1; 228/245

(58) Field of Classification Search ..................... None
See application file for complete search history.

(56) References Cited

U.S. PATENT DOCUMENTS

| | | | |
|---|---|---|---|
| 4,838,474 A * | 6/1989 | Ohashi et al. ............... | 228/121 |
| 6,020,076 A * | 2/2000 | Fujii et al. .................... | 428/621 |
| 6,106,960 A * | 8/2000 | Fujii et al. ................... | 428/627 |
| 6,108,190 A | 8/2000 | Nagasaki | |
| 6,268,069 B1 | 7/2001 | Ohashi et al. | |
| 6,310,755 B1 | 10/2001 | Kholodenko et al. | |
| 6,462,928 B1 | 10/2002 | Shamouilian et al. | |
| 6,590,760 B1 * | 7/2003 | Fujii .......................... | 361/234 |
| 2002/0036881 A1 | 3/2002 | Shamouilian et al. | |
| 2002/0075624 A1 | 6/2002 | Wang et al. | |
| 2003/0222416 A1 * | 12/2003 | Sago et al. .................. | 279/128 |
| 2004/0042152 A1 * | 3/2004 | Ishizaka et al. ............. | 361/234 |
| 2005/0023270 A1 * | 2/2005 | Hiramatsu et al. ........ | 219/444.1 |
| 2006/0162849 A1 * | 7/2006 | Han ........................... | 156/153 |
| 2006/0182908 A1 * | 8/2006 | Fujii ........................ | 428/34.4 |

FOREIGN PATENT DOCUMENTS

| | | |
|---|---|---|
| EP | 0 945 414 | 9/1999 |
| JP | 61-215273 | 9/1986 |
| JP | 62028091 A * | 2/1987 |
| JP | 09-059074 | 3/1997 |
| JP | 11-163109 A1 | 6/1999 |
| JP | 11-278951 | 10/1999 |
| JP | 2001-102436 | 4/2001 |

\* cited by examiner

*Primary Examiner*—Kiley Stoner
(74) *Attorney, Agent, or Firm*—Burr & Brown

(57) ABSTRACT

A method of fabricating a substrate placing stage includes the step of providing a plate-shaped ceramic base having a substrate placing surface on a side of the ceramic base. The method includes the step of providing a plate-shaped ceramic base formed of a composite material containing components of a ceramic material and an aluminum alloy. The method includes the step of inserting a joint material including an aluminum alloy layer between the ceramic base and the cooling member. The method includes the step of heating the joint material at a temperature in a range from TS ° C. to (TS-30) °C. (TS °C.: a solidus temperature of the aluminum alloy). The method includes the step of pressing substantially normally joint surfaces of the ceramic base and the cooling member, thereby joining the ceramic base and the cooling member via the joint material to obtain a joint layer including the aluminum alloy layer having a thickness in a range from 50 μm to 200 μm after joining.

9 Claims, 1 Drawing Sheet

US 7,353,979 B2

METHOD OF FABRICATING SUBSTRATE PLACING STAGE

CROSS-REFERENCE TO RELATED APPLICATIONS

This application is based upon and claims the benefit of priority from Japanese Patent Application No. 2003-330493 filed on Sep. 22, 2003; the entire contents of which are incorporated herein by reference.

BACKGROUND OF THE INVENTION

The present invention relates to a substrate placing stage, more specifically, to a method of fabricating a substrate placing stage having a structure of joining a ceramic base and a cooling member together.

Conventionally, the semiconductor fabricating process uses various substrate placing stages such as ceramic heaters or electrostatic chucks for placing semiconductor wafers.

For example, a ceramic heater or an electrostatic chuck is structured to embed an electrode in the form of a wire, a plate or a film inside a discoid ceramic base corresponding to the shape of a wafer. This is used to set the substrate to a predetermined temperature or to fix the wafer on the substrate placing stage by adsorption utilizing the Coulomb force or the Johnson-Rahbek force.

Recently, the semiconductor etching process and the like include the proposed so-called low-temperature etching process. In this process, for the purpose of further improving an etching selection ratio and an aspect ratio of an etching shape, etching is performed while cooling the wafer at the same time. In addition thereto, in various thin-film processes or in the characteristic evaluation of the substrate, there are increasingly more processes which require the cooling of the wafer. Even when used in a process at a high temperature, it is desirable to add a cooling function to the substrate placing stage so as to restitute the temperature of the substrate back to a room temperature in a shorter time.

To meet such demands, a specific substrate placing stage has been disclosed (in Japanese Unexamined Patent Publication No. 11(1999)-163109, col. 0017, etc.). The substrate placing stage uses a base body made of a composite material containing ceramic and metal as a heat sink. The base body is joined by brazing solder to a ceramic base as the substrate placing stage by use of brazing filler metal. The composite material provides a lower thermal expansion coefficient as compared to a metallic material and also has fine workability.

SUMMARY OF THE INVENTION

The composite material, however, includes porous ceramics filled with metal, with difficulty to fabricate one having uniform quality because of the structural nature thereof. Therefore, the composite material has the thermal expansion coefficient, heat conductivity, melting point, strength, and the like that are apt to vary in dependence on the location. For this reason, after being joined to the ceramic base by brazing solder, the composite material are likely to produce warpage of the substrate placing surface, variations in heat conductivity and the like due to the residual stress of the joint.

The variations in characteristics of the composite material may cause reduction in temperature uniformity of a semiconductor wafer placed on the substrate placing stage in an in-plane direction and reduction in yields of the semiconductor fabricating processes.

A brazing solder is used to join the conventional ceramic base and the cooling member formed of the composite material. In the brazing solder, the brazing metal filler is set to a higher temperature condition than a liquidus temperature into a complete melting, then being cooled down. During cooling after the melting, the brazing metal filler substantially shrinks. This shrinkage tends to leave pores called shrinkage cavities at the brazed part. Since the pores do not contribute to joining, the substantial joint between the ceramic base and the composite material has smaller area than the entire interface to be joined. Therefore, it is desirable to reduce the pores and thereby to increase the substantial area for being joined. Further, the existence of the shrinkage cavities may deteriorate variations in heat conductivity and strength in the in-plane direction.

The present invention is directed to a method of fabricating a substrate placing stage which efficiently prevents the occurrence of defects in a substrate placing stage due to variation in characteristics of a composite material, thus ensuring excellent joining strength and temperature uniformity. The substrate placing stage includes a structure of joining a ceramic base and a cooling member formed of a composite material containing ceramic and aluminum together.

This aspect of the invention provides the following method of fabricating a substrate placing stage. The method includes the step of providing a plate-shaped ceramic base having a substrate placing surface on a side of the ceramic base. The method includes the step of providing a plate-shaped ceramic base formed of a composite material containing components of a ceramic material and an aluminum alloy. The method includes the step of inserting a joint material including an aluminum alloy layer between the ceramic base and the cooling member. The method includes the step of heating the joint material at a temperature in a range from TS °C. to (TS-30) °C. (TS°C.: a solidus temperature of the aluminum alloy). The method includes the step of pressing substantially normal to the joint surfaces of the ceramic base and the cooling member, thereby joining the ceramic base and the cooling member via the joint material to obtain a joint layer including the aluminum alloy layer having a thickness in a range from 50 μm to 200 μm after joining.

In accordance with the aspect, the ceramic base and the cooling member of the composite material are joined to each other with the joint layer including the aluminum alloy layer, mainly using a mechanical press-joining method without melting. The method eliminates production of pores caused by melting and solidification, obtaining excellent joint strength. The joining method ensures a thickness of the Al alloy layer, which is not achieved by brazing-solder joint. The Al alloy layer with a thickness in a range from 50 μm to 200 μm effectively reduces residual stress in the ceramic base at the joint portion, which reduces variations in characteristics of the composite material. This prevents warpage of the substrate placing surface due to the residual stress, and improves close-contactability between the substrate and the substrate placing surface, thus enhancing temperature uniformity of the substrate.

For more effective reduction in residual stress at the joint portion, the aluminum alloy layer may have a thickness in a range from 100 μm to 150 μm.

The joint layer may include first and second aluminum alloy layers. The joint layer may include a metallic plate interposed between the first and second aluminum alloy layers.

The metallic plate may use molybdenum (Mo), tungsten (W), or kovar alloy which has a lower thermal expansion coefficient.

If the two aluminum alloy layers have a metallic plate with a lower thermal expansion coefficient that is interposed therebetween, when the composite material has variations in property such as thermal expansion coefficient, the interposition of the metallic plate reduces difference in thermal expansion coefficient between the composite material and ceramic base. This prevents warpage or fracture of the ceramic base.

The ceramic base may contain at least one ceramics selected from the group consisting of, for example, aluminum nitride, silicon carbide, alumina, silicon nitride, and sialon.

The composite material may contain aluminum and at least one ceramic selected from the group consisting of aluminum nitride, silicon carbide, alumina, silicon nitride, and sialon.

When the ceramic base uses aluminum nitride as a main component, the cooling member may use a composite material containing silicon carbide and aluminum. This combination allows the ceramic base and the cooling member to be excellently adjusted in thermal expansion coefficient.

The ceramic base may have an electrode shaped in a film, a plate or a straight line and embedded therein. The electrode may function as at least one of an electrostatic chuck, a heater, and an electrode for generating high-frequency plasma.

In the method of fabricating the substrate placing stage of the invention, the joint surfaces may have a pressure applied substantially normally to the joint surfaces in the step of joining, the pressure being set in a range from 4.9 MPa to 19.6 MPa.

As described above, according to the method of fabricating a substrate placing stage of the invention, the joint layer joining the ceramic base and the cooling member of a composite material achieves excellent joint with less joint-defects. The joint layer with a predetermined thickness reduces residual stress, and variations in characteristics of the composite material, which reduces warpage of the substrate placing surface. Thus, the placed substrate achieves high temperature uniformity, which significantly improves yield in semiconductor fabricating process.

BRIEF DESCRIPTION OF THE ACCOMPANYING DRAWINGS

DETAILED DESCRIPTION OF THE PREFERRED EMBODIMENTS

A substrate placing stage according to an embodiment includes a ceramic base having a wafer placing surface. The substrate placing stage includes a cooling member formed of a composite material containing ceramics and aluminum. The substrate placing stage includes a joint layer containing an aluminum alloy layer between the ceramic base and the cooling member. Specifically, the ceramic base, the joint layer, and the cooling member are mechanically pressed and joined together. The aluminum alloy layer has a thickness in a range from 50 μm to 200 μm inclusive, which is thicker than a conventional brazing joint layer.

The ceramic base includes at least a placing surface for various wafers. In addition to ceramic bases embedding electrodes in the form of films, plates, and wires therein, the ceramic base may not include an electrode embedded therein. The ceramic base with an electrode embedded therein has a function as a ceramic heater, an electrostatic chuck, an electrostatic chuck provided with a heater or an electrode for generating radio-frequency plasma, or the like. The cooling member may be anything as long as it has a function of a heat sink. The cooling member may be provided with a passage for a coolant inside, or without the passage. The cooling member may be provided with a coolant pipe or a heat sink on the outside adjacent to the composite material.

Structure of Substrate Placing Stage

Figure 1:
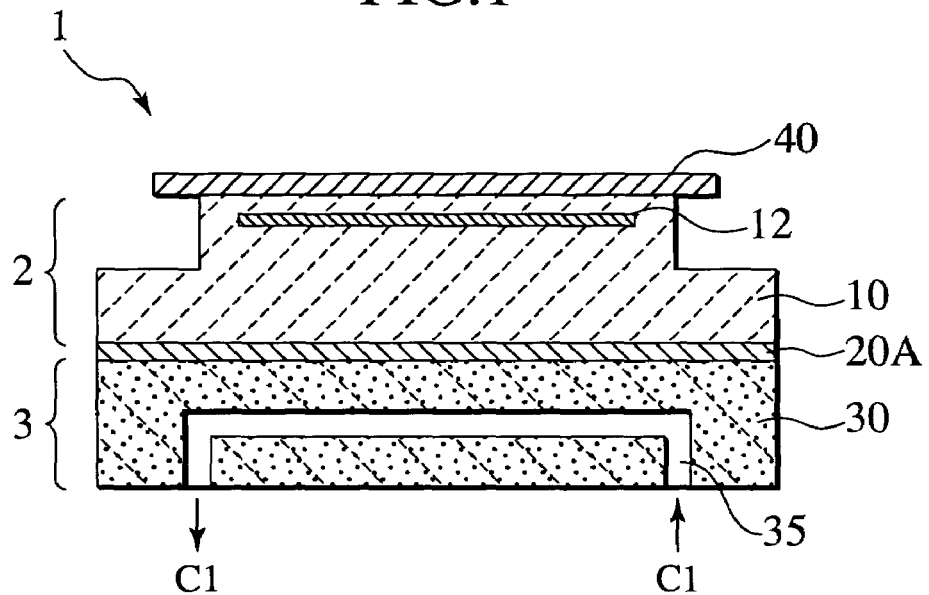
FIG. 1 is a cross-sectional view illustrating a structure of a substrate placing stage according to an embodiment of the present invention, where C1 indicates cooling water.

With reference to FIG. 1, the following describes an example of a substrate placing stage 1 with a ceramic base 10 having a function as an electrostatic chuck. The substrate placing stage 1 includes an electrostatic chuck 2 and a cooling member 3. The ceramic base 10 corresponds in size and shape to a wafer to be fixed thereon, with a discoid shape having a diameter in a range from 80 to 300 mm, for example. The ceramic base 10 includes a plate-shaped electrode 12 embedded therein. The electrode 12 includes a terminal (not shown) drawn out therefrom. One of surfaces proximate to the electrode 12 corresponds to a wafer adsorption surface, that is, a substrate placing surface. For example, as shown in FIG. 1, a wafer 40 is fixed by adsorption onto the substrate placing surface, slightly smaller in area than the wafer, in an overhung manner.

The electrode 12 uses refractory metal such as Mo or W, for example. The electrode 12, without particular limitation in configuration, uses an electrode made of bulk metal such as a mesh, and may use a film electrode formed by printing, drying and then firing metal paste. When the metal bulk electrode is used as the embedded electrode, the electrode 12 may be also used as an electrode for generating radio-frequency plasma, and, particularly preferably, for plasma etching, radio-frequency sputtering, plasma chemical vapor deposition (CVD) or the like. The electrode is not limited to an integrated electrode in shape, but also may be separated into plural electrodes such as a bipolar electrode.

The ceramic base 10 uses various ceramic materials, for example, oxide ceramics such as alumina ($Al_2O_3$), nitride ceramics such as aluminum nitride (AlN), silicon nitride ($Si_3N_4$) or sialon, and carbide ceramics such as silicon carbide (SiC). Among these materials, aluminum nitride is suitably used, with excellent corrosion resistance and high heat conductivity.

The cooling member 3 is formed of a composite material 30 containing ceramic and aluminum. The cooling member 3 may include a coolant passage 35 to enhance a cooling function where appropriate. The composite material 30 is a composite material having a metal filled into a porous ceramic body. The approximation of the composite material 30 to the ceramic base in thermal expansion coefficient is resistant to warpage or peeling at the joint portion after joining to the ceramic base 10. The excellent workability reduces process loads when providing the coolant passage 35 thereto. Further, as the metal is filled therein, the composite material 30 exhibits higher heat conductivity than that of a single ceramic and thereby allowing the ceramic base 10 to be efficiently cooled.

The ceramic material for constituting the composite material 30, without particular limitation, may use a porous ceramic material identical to or different from the ceramic base 10. The ceramic material may use, for example, alumina, aluminum nitride, silicon carbide, silicon nitride, sialon. Meanwhile, the metal filled in the porous ceramic material should preferably have high corrosion resistance and may preferably use, for example, a fine filling property, and Al or an alloy of Al and Si.

For example, an aluminum nitride material has a thermal expansion coefficient of about 4.5 ppm/K, while Al has a thermal expansion coefficient of 26 ppm/K. Meanwhile, a composite material containing aluminum nitride and Al has a thermal expansion coefficient in a range from about 7 to 10 ppm/K, and a composite material containing silicon carbide and Al has a thermal expansion coefficient in a range from about 4 to 7 ppm/K. Accordingly, when aluminum nitride is used as the ceramic base 10 and a composite material containing silicon carbide and Al is used as the composite material, it is possible to substantially reduce a difference in thermal expansion between both materials. This reduces production of residual stress at the joint portion due to the difference in thermal expansion coefficient.

This embodiment has a joint layer 20A that includes an Al alloy sheet interposed between the ceramic base 10 and the composite material 30 (the cooling member 3). The Al alloy sheet is heated at a temperature in a range between a solidus temperature and a liquidus temperature thereof, and pressure is applied substantially normal to joint surfaces. The heating and pressure application allows the ceramic base 10 and the composite material 30 to be joined together with the joint layer 20A interposed therebetween. The joining according to mechanical press-joining method does not melt the Al alloy sheet, thus producing no shrinkage cavities (pores) in comparison with brazing solder. This prevents production of joint defects due to shrinkage cavities, thus ensuring a substantially large joint area.

In the meantime, the inventors of the present invention investigated a relation between the joint layer and the residual stress remaining at the joint portion relative to the structure of the substrate placing stage according to this embodiment, finding out that the Al alloy layer with a thickness in a predetermined range efficiently reduces the residual stress remaining at the joint portion. Specifically, the Al alloy layer is preferably set to a thickness in a range from about 50 μm to 200 μm, both inclusive in term of variations in thermal expansion coefficient of the composite material. The range in thickness reduces warpage of the substrate placing stage as compared to the conventional brazing solder method. In addition, the range permits the substrate placing surface to be set to equal to or below 100 μm in flatness. Moreover, the thickness of the Al alloy layer is preferably set in a range from about 100 μm to 150 μm, both inclusive. The range of thickness allows the substrate placing surface to be set equal to or below 100 μm in flatness, which enhances temperature uniformity of the substrate.

The application of the conventional brazing solder method causes Al alloy to be melted to run out. Accordingly, the method allows for fabrication of the Al alloy layer in the thickness of about 10 μm at a maximum. On the contrary, the application of the above-described mechanical press-joining method forms the Al alloy layer with a thickness in a range from about 50 μm to 200 μm, both inclusive.

The Al alloy layer with a thickness equal to or above 50 μm has high heat conductivity in the in-plane direction thereof. This high heat conductivity suppresses variations in heat conductivity of the composite material, even when the composite material 30 has variations in heat conductivity in the in-plane direction. The Al alloy layer with a thickness equal to or above 50 μm reduces variations in strength of the Al alloy layer by use of the plastic deformation property of the Al alloy layer.

The Al alloy layer includes aluminum as the main component. At least one or more metal selected from the group consisting of magnesium, titanium, zirconium, and hafnium is added to the Al alloy layer, which preferably improves wettability relative to the ceramic base 10. Excessive addition of the metal degrades corrosion resistance. Accordingly, it is preferable to add such metal in a range from 0.3 wt % to 5.0 wt %, both inclusive.

Silicon or boron may be further added to the Al alloy layer to lower the liquidus temperature. The amount of addition of the silicon or boron is set preferably equal to or below 20 wt % or more preferably in a range from 1 wt % to 12 wt % inclusive to prevent degradation of the corrosion resistance.

Figure 2:
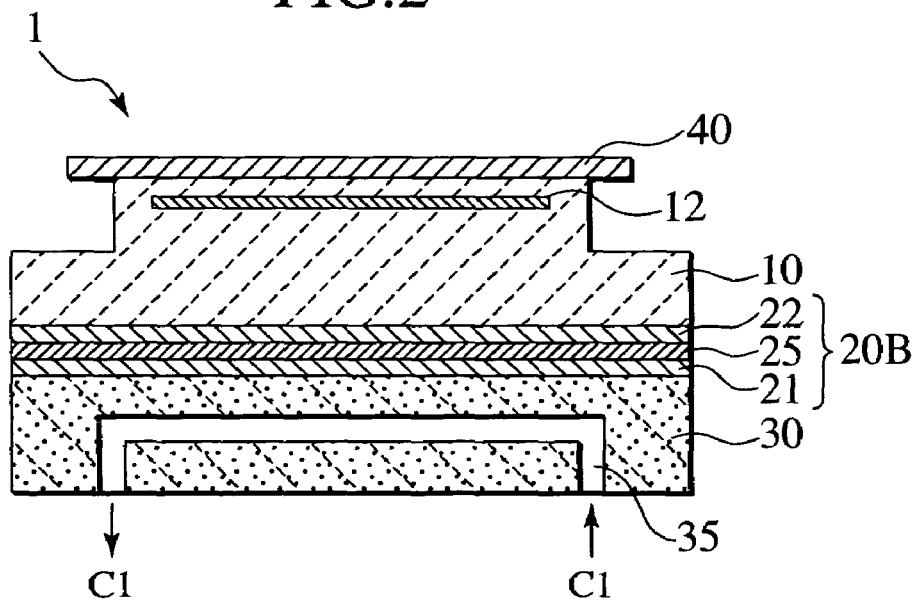
FIG. 2 is a cross-sectional view illustrating a structure of a substrate placing stage according to another embodiment of the present invention, where C1 indicates cooling water.

Referring to FIG. 2, the following describes a structure of a substrate placing stage according to another embodiment of the invention. The stage includes a joint layer 20B that joins the ceramic base 10 and the composite material 30 together. The joint layer 20B applies a laminate body of a three-layer structure where a metallic plate with a low thermal expansion coefficient is interposed between two Al alloy layers 21 and 22. This metallic plate may be made of molybdenum (Mo), tungsten (W), kovar alloy, and the like, for example. The interposition of the metallic plate between the joint layers reduces influence of variations in thermal expansion coefficient of the composite material, even if the composite material has variations in thermal expansion coefficient resulting from variations in fabrication condition.

For prevention of warpage of the substrate placing stage, the ceramic base is preferably set to a thermal expansion approximately proximate to that of the metallic plate. Therefore, when aluminum nitride is used as the ceramic base, molybdenum (Mo) is preferably used as the metallic plate. Meanwhile, when silicon carbide is used as the ceramic base, tungsten (W) is preferably used as the metallic plate. Additionally, when alumina is used as the ceramic base, kovar alloy is preferably used as the metallic plate.

Method of Fabricating Substrate Placing Stage

The following describes a method of fabricating a substrate placing stage according to this embodiment. Firstly, the ceramic base and the cooling member will be fabricated respectively.

Upon fabrication of the ceramic base, ceramic raw material powder such as aluminum nitride, and sintering aid raw material powder such as yttria ($Y_2O_3$), silica ($SiO_2$) or alumina ($Al_2O_3$) are blended at given compounding ratios. The blend is mixed together by use of a pot mill, a ball mill or the like. The mixing may be carried out either by a wet process or by a dry process. When the wet process is applied, a drying treatment is carried out after mixing. This produces a mixed raw-material powder. Thereafter, the mixed raw material powder itself is molded, or the powder is granulated with a binder, thus producing, for example, a discoid compact. The molding method is not particularly limited, and various methods are applicable. For example, the molding method may apply a die casting method, a cold isostatic pressing (CIS) method, a slip casting method, and the like. Further, the obtained compact is fired by use of a hot pressing method or a normal pressure sintering method, thus fabricating a sintered body. Aluminum nitride is fired at a temperature in a range from about 1700° C. to 1900° C.

Alumina is fired in a temperature range of about 1600° C. Sialon is fired in a temperature range from about 1700° C. to 1800° C. Silicon carbide is fired in a temperature range from about 2000° C. to 2200° C.

Upon fabrication of an electrostatic chuck or a heater, a predetermined electrode is embedded in the molding process. For example, in the case of the electrostatic chuck, it is preferable that a planar electrode having holes and made of a metal bulk body, more preferably a meshed electrode is embedded in the raw material powder. Upon fabrication of the heater, as in the case of the electrostatic chuck, a metal bulk body, formed into a predetermined shape such as a coil shape or a spiral shape, is embedded therein. Those electrodes preferably apply, for example, refractory metal such as molybdenum or tungsten.

The electrode for the electrostatic chuck may apply a film electrode which is formed by printing, drying and then firing metal paste. In this case, in the molding process, two green discoid sheets may be fabricated, for example, and a metal electrode in paste may be printed on the surface of one of the green sheets. Then, the other green sheet may be laminated, with the printed electrode interposed therebetween, to fabricate a green sheet laminated body. The green sheet laminated body may be subjected to firing. When the ceramic base has the embedded electrode therein as well as the electrostatic chuck and the heater, the sintered body after firing is subjected to a process for forming holes which are used for terminals for drawing electrode from the embedded electrode.

The composite material as the cooling member may apply a purchasable commercial product. In case of fabricating the composite material, a porous ceramic body is fabricated firstly. A ceramic powder is molded and then fired at a slightly lower temperature than usual, thus fabricating a porous ceramic with a porosity, for example, in a range from 10% to 70%. Melted Al is poured into this porous ceramic, whereby the porous ceramic is impregnated with the melted Al. The composite material thus obtained is formed into a predetermined shape to be used as the cooling member.

Next, the ceramic base and the composite material are joined together. In this joining process, an Al alloy sheet with a thickness in a range from about 50 μm to 200 μm is inserted between the ceramic base and the composite material. Thereafter, the Al alloy sheet is heated in a vacuum equal to or below 13.3 Pa (0.1 Torr) and under a heating condition where the temperature is equal to or below TS° C. which is the solidus temperature of the aluminum alloy and a temperature is equal to or above (TS-30)° C. The set of the temperature conditions for the joint in the above-described range allows for joining mainly by the mechanical press-joining, with the substantially initial thickness maintained and without melting the Al alloy sheet. For example, when using Al alloy containing 10 wt % of Si and 1.5 wt % of Mg as the Al alloy layer, the solidus temperature TS of such an Al alloy layer is equal to 560° C. Accordingly, the heating condition for joining is set in a range from 500° C. to 560° C., or more preferably in a range from 530° C. to 550° C.

When the temperature is almost stable, pressure is applied in a uniaxial direction substantially normal to the joint surface. A pressure load is set in a range from 4.9 MPa to 19.6 MPa (50 to 200 kgf/cm$^2$). Al alloy in the solidus state is subjected to application of the above-described pressure load, and is joined tightly to the ceramic base and to the composite material.

In this joining process, the Al alloy sheet is not melted. Accordingly, there are no shrinkage cavities (pores) caused by solidification after the melting, and it is possible to expand the substantial area for being joined as compared to that in the case of brazing solder. This improves the joint layer in joint strength. Further, in the above-described joining method, it is possible to substantially maintain the thickness of the Al alloy sheet even after joining. This allows for formation of the thick joint layer with a thickness equal to or above 50 μm. The ceramic base to be used as the joint surface may be formed with a metal thin film or the like in advance prior to joining.

When fabricating the joint layer having the three-layer structure formed by interposing the metallic plate between the Al alloy layers as shown in FIG. 2, instead of insertion of the Al alloy sheet between the ceramic base and the composite material, it is only necessary to insert two Al alloy sheets while interposing the metallic plate therebetween. In this case, each of Al alloy sheets ranges in thickness from about 50 μm to 200 μm, or more preferably from 100 μm to 150 μm. Mo or the like is used for the metallic plate, with a thickness in a range from 50 μm to 500 μm.

As described above, in the substrate placing stage and the manufacturing method thereof according to this embodiment, the ceramic base and the cooling member are joined together tightly. In the substrate placing stage, even when the composite material constituting the cooling member has variations in characteristics, the thickness of the joint layer as a buffer material relieves variations in the respective characteristics in the in-plane direction. Such relief can reduce warpage and thereby provide a substrate placing stage having high temperature uniformity.

EXAMPLES

The following describes examples and comparative examples of the present invention.

Examples 1 to 3

Firstly, a ceramic base having a function as an electrostatic chuck was fabricated. Specifically, an acrylic resin binder was added to aluminum nitride powder which was obtained by a reduction-nitridation method, and then granules were formed by a spray granulation method. In this granulation process, uniaxial pressure molding was performed by use of a die. In this molding process, a Mo bulk electrode which was a mesh electrode in the form of plate was embedded in a compact. This compact was subjected to hot press firing, thus fabricating an integrated sintered body. Pressure at the hot press process was set to 200 kg/cm$^2$. During firing, the temperature was raised up to the maximum temperature of 1900° C. at a rate of 10° C./hour, and then the maximum temperature was maintained for 1 hour. This fabricates a discoid aluminum nitride ceramic base having a diameter of 200 mm and a thickness of 10 mm. The ceramic base, after firing, is formed with through-holes each having an outside diameter of 5 mm at three positions on a circular arc which has a radius of 90 mm relative to the central axis.

Concerning the composite material, silicon carbide (SiC) grains having grain sizes in a range from 50 μm to 100 μm were molded into a compact by use of a uniaxial pressing. The compact was fired under a nitrogen atmosphere at temperatures in a range from 1900° C. to 2200° C. This obtains a porous SiC sintered body having porosity of 30%. The SiC sintered body was impregnated with a melted aluminum (Al) alloy, thus obtaining a composite material having a volume ratio of Al and SiC equivalent to 30:70.

This composite material was formed into a discoid shape having a diameter of 23 mm and a thickness of 20 mm. In addition, the composite material was formed with through-holes of 5 mm in diameter at the positions in coincidence with those on the ceramic base by means of a drilling process.

The Al alloy sheet includes Al alloy containing 10 wt % of Si and 1.5 wt % of Mg (hereinafter referred to as "Al-10Si-1.5Mg") and has a thickness of 120 µm. The Al alloy sheet was cut into a shape having an outside diameter of 200 mm so as to conform with the shape of the joint surface of the ceramic base. In addition, through holes were cut out similarly. The Al alloy sheet after the cutting process was inserted between the ceramic base and the composite material. All these constituents were joined together under conditions of $1 \times 10^{-4}$ Torr ($1.33 \times 10^{-2}$ Pa) and 100 kg/cm² ($9.8 \times 10^6$ Pa).

The temperature for joining was set to 550° C. in Example 1, the temperature for joining was set to 530° C. in Example 2, and the temperature for joining was set to 555° C. in Example 3. In each of the temperature conditions, the temperature was equal to or below 560° C. which was the solidus temperature (Ts) of Al alloy, and was equal to or above the solidus temperature (Ts) −30° C.

Comparative Example 1

The temperature for joining the ceramic base and the composite material was set to 600° C., which was higher by 9° C. than the liquidus-line temperature of Al alloy. In other words, joining was carried out by means of brazing solder. Other conditions were similar to those used in Examples 1 to 3.

Comparative Example 2

As similar to Comparative Example 1, the temperature for joining the ceramic base and the composite material was set to 600° C., which was higher by 9° C. than the liquidus temperature of Al alloy. However, to improve wettability of Al alloy relative to the ceramic base, a Ti layer was formed on the joint surface in advance by a sputtering method, and joining was performed thereafter. Other conditions were similar to those used in Examples 1 to 3.

Comparative Example 3

As similar to Comparative Example 2, to improve wettability of Al alloy relative to the ceramic base, the Ti layer was formed on the joint surface in advance by the sputtering method, and joining was performed at a temperature of 600° C. thereafter. However, the press load for joining was reduced to 1/100, namely, 1 kg/cm² ($9.8 \times 10^4$ Pa) to attempt to prevent Al alloy from being formed into a thin film. Other conditions were similar to those used in Examples 1 to 3.

Comparative Example 4

Al alloy paste (JISAC9B) was used as a material for the joint layer. The temperature for joining was set to 600° C. so as to be higher than the liquidus-line temperature of the Al alloy powder paste which was 570° C., and the press load for joining was set to 1 kg/cm² ($9.8 \times 10^4$ Pa). Other conditions were similar to those used in Examples 1 to 3.

Comparative Example 5

A Mo plate was formed into the same shape as the composite member in Example 1, and was used as the cooling member. Other conditions were similar to those used in Examples 1 to 3.

Evaluation

Concerning the substrate placing stages in the respective Examples and Comparative Examples, (a) the thickness of the joint layer, (b) the warpage of the substrate placing stage, (c) the defective area in the joint surface, and (d) the sealing property of the joint after joining were evaluated.

The degree of warpage of the substrate placing stage was evaluated by way of the flatness of the substrate adsorption surface. The flatness was measured by use of a three-dimensional gauge. Concerning the defective area in the joint surface, a defective area on the interface between the ceramic base and the joint layer was measured by use of an ultrasonic flaw detector. Moreover, the sealing property of the joint was evaluated by flowing He to the through holes in three positions and then measuring the amount of leak of He to the outside of the joint by using a He leak detector.

In Examples 1 to 3, the thickness of the Al alloy layer after joining was not different largely from the thickness thereof before joining, and the thickness of about 120 µm was maintained. On the contrary, in Comparative Examples 1 to 3, despite the improved wettability by means of Ti sputtering onto the joint surface and reduction in the press load for joining, the Al alloy layer was melted and flew out of the joint and the vicinity thereof. As a consequence, the thickness was reduced to a range from 5 to 10 µm after joining.

In Comparative Example 4, JIS-AC9B was used instead of the Al alloy layer. Since the temperature for joining was set to a condition where the temperature was higher than the liquidus temperature, the thickness of the joint layer after joining was reduced to about 10 µm.

In Comparative Examples 1 to 4, the pores which were the shrinkage cavities remained on the joint surface, and that portion caused joining defects. For this reason, as compared to Examples 1 to 3, the joining defect area ratios were considerably higher. In Comparative Example 1, joining itself was impossible. In Comparative Examples 2 to 4, although joining of the ceramic base and the composite material was possible, the sealing property of the joint was degraded, and a large amount of He which was supplied to the through-holes leaked out of the joint layer and the vicinity thereof.

In Comparative Examples 1 to 4, the joint layer could not relieve the variations in characteristics of the composite member, causing warpage on the substrate placing surface of the substrate placing stage as a consequence. In Comparative Example 5, the Mo material was used as the cooling member instead of the composite material. When using a metallic material as the cooling member, the joint layer cannot sufficiently reduce stress caused by a difference in the thermal expansion coefficients between the ceramic base and the composite member. This produces the warpage on the substrate placing stage.

On the contrary, in Examples 1 to 3, excellent joining, which causes less joining defects and a high sealing property, can be obtained. The joint layer functions as a buffer material against the stress, reducing the warpage of the substrate placing stage. The reduction improves the flatness in a range from 40 µm to 50 µm.

TABLE 1

|  | Cooling Member Material | Joint Layer Material | Joint Surface Pre-treatment | Joint Temperature (° C.) | Joint Press Load (kg/cm²) |
|---|---|---|---|---|---|
| Example 1 | Al—SiC Composite Material | Al-10Si-1.5Mg Note (1) | — | 550 | 100 |
| Example 2 | Al—SiC Composite Material | Al-10Si-1.5Mg | — | 535 | 100 |
| Example 3 | Al—SiC Composite Material | Al-10Si-1.5Mg | — | 555 | 100 |
| Comparative Example 1 | Al—SiC Composite Material | Al-10Si-1.5Mg | — | 600 | 100 |
| Comparative Example 2 | Al—SiC Composite Material | Al-10Si-1.5Mg | Ti spattering | 600 | 100 |
| Comparative Example 3 | Al—SiC Composite Material | Al-10Si-1.5Mg | Ti spattering | 600 | 1 |
| Comparative Example 4 | Al—SiC Composite Material | JISAC9B | — | 600 | 1 |
| Comparative Example 5 | Mo | Al-10Si-1.5Mg | — | 555 | 100 |

Note
(1): Al alloy with Si of 10 wt % and Mg of 1.5 wt % additives

TABLE 2

|  | Joint Layer Thickness After Joining (μm) | Substrate Placing Surface Flatness (μm) | Joint Defect Area Ratio (%) | He Leak (Pa·m³/s) |
|---|---|---|---|---|
| Example 1 | 120 | 50 | 5 | <1E−9 |
| Example 2 | 120 | 40 | 7 | <1E−9 |
| Example 3 | 120 | 50 | 3 | <1E−9 |
| Comparative Example 1 | 5 | 150 | Incapable Joint | — |
| Comparative Example 2 | 8 | 130 | 60 | Incapable Measurement |
| Comparative Example 3 | 10 | 130 | 40 | Incapable Measurement |
| Comparative Example 4 | 10 | 150 | 20 | Incapable Measurement |
| Comparative Example 5 | 120 | 150 | 5 | <1E−9 |

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

What is claimed is:

1. A method of fabricating a substrate placing stage, comprising:
    providing a plate-shaped ceramic base having a substrate placing surface on a side of the ceramic base;
    providing a plate-shaped cooling member formed of a composite material containing components of a ceramic material and an aluminum alloy;
    inserting a joint material including an aluminum alloy layer between the ceramic base and the cooling member;
    heating the joint material at a temperature in a range from TS °C. to (TS-30) °C., wherein TS °C. is a solidus temperature of the aluminum alloy;
    pressing substantially normal to joint surfaces of the ceramic base and the cooling member, thereby joining the ceramic base and the cooling member via the joint material to obtain a joint layer including the aluminum alloy layer having a thickness in a range from 50 μm to 200 μm after joining.

2. The method of claim 1,
    wherein the aluminum alloy layer has a thickness in a range from 100 μm to 150 μm after joining.

3. The method of claim 1,
    wherein the joint surfaces have a pressure applied thereto in the step of joining, the pressure being set in a range from 4.9 MPa to 19.6 MPa.

4. The method of claim 1,
    wherein the joint layer comprises a laminated body,
    wherein the laminated body comprises:
        first and second aluminum alloy layers; and
        a metallic plate interposed between the first and second aluminum alloy layers.

5. The method of claim 1,
    wherein the ceramic base contains at least one ceramic selected from the group consisting of aluminum nitride, silicon carbide, alumina, silicon nitride, and sialon.

6. The method of claim 1,
    wherein the composite material contains aluminum and at least one ceramic selected from the group consisting of aluminum nitride, silicon carbide, alumina, silicon nitride, and sialon.

7. The method of claim 4,
    wherein the metallic plate contains a metal selected from the group consisting of molybdenum (Mo), tungsten (W), and kovar alloy.

8. The method of claim 1,
    wherein the ceramic base contains aluminum nitride as a main component, wherein the composite material contains silicon carbide and aluminum.

9. The method of claim 1,
wherein the ceramic base has an electrode shaped in a film, a plate or a straight line and embedded therein, wherein the electrode functions as at least one of an electrostatic chuck, a heater, and an electrode for generating high-frequency plasma.

* * * * *